United States Patent

Morris et al.

(10) Patent No.: US 9,142,938 B2
(45) Date of Patent: Sep. 22, 2015

(54) APPARATUS AND METHOD OF ESTABLISHING OPTICAL COMMUNICATION CHANNELS BETWEEN A STEERABLE ARRAY OF LASER EMITTERS AND AN ARRAY OF OPTICAL DETECTORS

(75) Inventors: Terrel L. Morris, Garland, TX (US); David Martin Fenwick, Chelmsford, MA (US); Richard John Luebs, Windsor, CO (US); Duane A. Wegher, Ft. Collins, CO (US); Jeffry D. Yetter, Loveland, CO (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 1363 days.

(21) Appl. No.: 12/630,044

(22) Filed: Dec. 3, 2009

(65) Prior Publication Data

US 2010/0074294 A1   Mar. 25, 2010

Related U.S. Application Data (62) Division of application No. 10/936,874, filed on Sep. 9, 2004, now Pat. No. 7,653,108.

(51) Int. Cl.
*H01S 5/00* (2006.01)
*H01S 5/40* (2006.01)

(52) U.S. Cl.
CPC ............ *H01S 5/4025* (2013.01); *H01S 5/4056* (2013.01)

(58) Field of Classification Search
None
See application file for complete search history.

(56) References Cited

U.S. PATENT DOCUMENTS

| 4,545,074 A | 10/1985 | Balliet |
| 4,568,931 A | 2/1986 | Biolley |
| 4,958,914 A * | 9/1990 | Owechko et al. ............... 349/17 |
| 5,023,863 A | 6/1991 | Masuda |
| 5,123,073 A | 6/1992 | Pimpinella |
| 5,218,654 A | 6/1993 | Sauter |
| 5,245,680 A | 9/1993 | Sauter |
| 5,420,954 A | 5/1995 | Swirhun |

(Continued)

FOREIGN PATENT DOCUMENTS

| EP | 311772 | 4/1989 |
| EP | 351729 | 1/1990 |

(Continued)

OTHER PUBLICATIONS

Merriam-Webster OnLine definition of "effect." No Date.*

(Continued)

*Primary Examiner* — Hrayr A Sayadian
(74) *Attorney, Agent, or Firm* — Van Cott, Bagley, Conwall & McCarthy (57) ABSTRACT

An array of light beam emitter sections comprises: a substrate having a surface divided into an array of sections; and a grouping of light emitters disposed at each surface section and configured to emit light beams at different emission angles with respect to the surface. Also disclosed is apparatus for establishing optical communication channels between the array of light beam emitter sections and an array of light detectors. Further disclosed is a method of establishing optical communication channels between the array of light emitter sections and the array of light detectors by mapping at least one light emitter of each grouping with a light detector of the detector array to establish optical communication channels between the arrays based on the mappings.

14 Claims, 10 Drawing Sheets

(56) References Cited

U.S. PATENT DOCUMENTS

| | | | |
|---|---|---|---|
| 5,430,442 A | 7/1995 | Kaiser | |
| 5,465,379 A | 11/1995 | Li | |
| 5,477,363 A | 12/1995 | Matsuda | |
| 5,497,465 A | 3/1996 | Chin | |
| 5,515,195 A | 5/1996 | McAdams | |
| 5,600,748 A | 2/1997 | Kosaka | |
| 5,631,988 A | 5/1997 | Swirhun | |
| 5,764,834 A | 6/1998 | Hultermans | |
| 5,877,876 A | 3/1999 | Birdwell | |
| 5,920,664 A | 7/1999 | Hirabayashi | |
| 6,014,206 A * | 1/2000 | Basting et al. | 356/138 |
| 6,169,594 B1 * | 1/2001 | Aye et al. | 349/196 |
| 6,181,845 B1 | 1/2001 | Horsthuis | |
| 6,185,648 B1 | 2/2001 | Munoz-Bustamante | |
| 6,334,784 B1 | 1/2002 | Howard | |
| 6,363,182 B2 | 3/2002 | Mills | |
| 6,379,053 B1 | 4/2002 | Van Doorn | |
| 6,430,335 B1 | 8/2002 | Carberry | |
| 6,509,992 B1 | 1/2003 | Goodwill | |
| 6,527,456 B1 | 3/2003 | Trezza | |
| 6,549,700 B1 * | 4/2003 | Sweatt et al. | 385/25 |
| 6,580,865 B1 | 6/2003 | Doorn | |
| 6,583,445 B1 | 6/2003 | Reedy | |
| 6,583,904 B1 | 6/2003 | Mahlab | |
| 6,587,605 B2 | 7/2003 | Paniccia | |
| 6,588,943 B1 | 7/2003 | Howard | |
| 6,603,899 B1 | 8/2003 | Popp | |
| 6,628,860 B1 | 9/2003 | Van Doorn | |
| 6,634,812 B2 | 10/2003 | Ozeki | |
| 6,651,139 B1 | 11/2003 | Ozeki | |
| 6,661,940 B2 | 12/2003 | Kim | |
| 6,674,971 B1 | 1/2004 | Boggess | |
| 6,775,480 B1 * | 8/2004 | Goodwill | 398/158 |
| 2002/0149825 A1 | 10/2002 | Levy | |
| 2002/0178319 A1 | 11/2002 | Sanchez-Olea | |
| 2003/0081281 A1 | 5/2003 | DeCusatis | |
| 2003/0138193 A1 * | 7/2003 | Sweatt et al. | 385/17 |
| 2004/0036990 A1 * | 2/2004 | Hanano | 359/831 |
| 2004/0105616 A1 | 6/2004 | Kazama | |
| 2006/0018216 A1 * | 1/2006 | Morris et al. | 369/47.1 |

FOREIGN PATENT DOCUMENTS

| | | |
|---|---|---|
| EP | 367460 | 5/1990 |
| EP | 811862 | 12/1997 |
| EP | 868049 | 9/1998 |
| EP | 1180912 | 2/2002 |

OTHER PUBLICATIONS

R. Sims, "Scaling Laws for MEMS Mirror-Rotation Optical Cross Connect Switches", Journal of Lightwave Technology, vol. 20, No. 7, Jul. 2002, p. 1084-1094.

F. Tooley, "Challenges in Optically Interconnecting Electronics", IEEE Journal of Selected Topics in Quantum Electronics, vol. 2, No. 1, Apr. 1996, p. 3-13.

B. Robertson, et al., "Design and Operation of an in situ Microchannel Alighment-Detection System", Applied Optics, vol. 37, No. 23, Aug. 10, 1998, p. 5368-5376.

B. Robertson, "Design of an Optical Interconnect for Photonic Backplane Applications", Applied Optics, vol. 37, No. 14, May 10, 1998, p. 2974-2984.

M. Jonsson, et al. "Optical Interconnection Technology in Switches, Routers and Optical Cross Connects", Ericsson Report, p. 1-43.

* cited by examiner

APPARATUS AND METHOD OF ESTABLISHING OPTICAL COMMUNICATION CHANNELS BETWEEN A STEERABLE ARRAY OF LASER EMITTERS AND AN ARRAY OF OPTICAL DETECTORS

CROSS-REFERENCE TO RELATED APPLICATION

The present application is a divisional application of application Ser. No. 10/936,874, filed Sep. 9, 2004 now U.S. Pat. No. 7,653,108, the contents of which are incorporated herein in its entirety.

BACKGROUND OF THE INVENTION

The present invention relates to optical communication systems, in general, and more particularly to apparatus and method of establishing optical communication channels between a steerable array of laser emitters and an array of optical detectors.

Greater demands for increased bandwidth are being made on data communication between electrical data processing units or subunits, for example. Communication rates of gigabits per second are exemplary of such demands. These demands can not be met by traditional metal electrical connections, like those found on mother boards and back plane connections. Optical communication channels between an array of light emitters and an array of light detectors have been proposed to satisfy these bandwidth demands. However, there are drawbacks to this solution.

Traditionally, communication channels have been formed between emitter/detector pairs of the arrays. To establish an optical communication channel between each emitter and detector of the arrays, the light emitted from each emitter of the emitter array must be precisely aligned with a corresponding light detector of the detector array to form the emitter/detector pairs. This precise alignment is no simple task and generally requires additional optical elements and man-hours to achieve. In addition, once the precise alignment is initially achieved, it may have to be repeated from time to time, due to misalignment as a result of such effects as dust, shock, vibration, temperature changes and the like, for example.

The present invention overcomes the drawbacks of configuring optical channels between arrays of emitters and detectors to provide a configuration of optical communication channels between arrays of light emitters and detectors without initial precise alignment and including a method for dynamic reconfiguration.

SUMMARY

In accordance with one aspect of the present invention, an array of light beam emitter sections comprises: a substrate having a surface divided into an array of sections; and a grouping of light emitters disposed at each surface section and configured to emit light beams at different emission angles with respect to the surface.

DETAILED DESCRIPTION OF THE INVENTION

Figure 1:
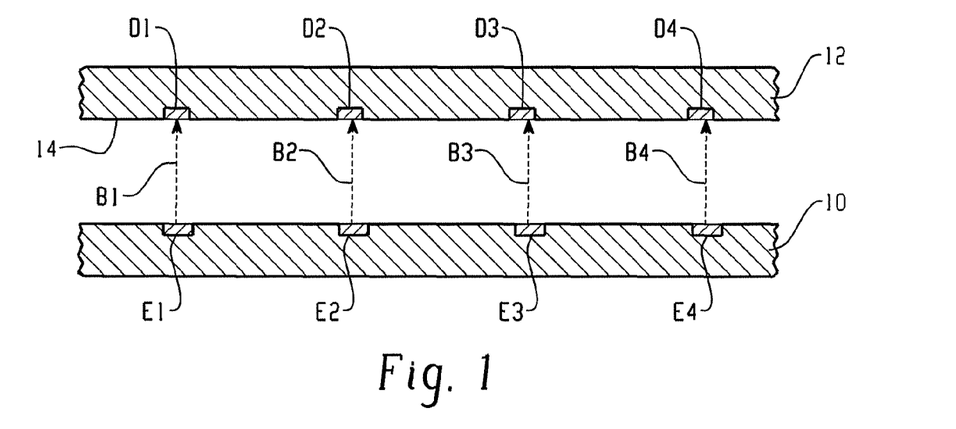
FIG. 1 is a cross-sectional sketch of an exemplary array of light emitters and light detectors in close juxtaposition with each other for optical communication therebetween.

FIG. 1 is a cross-sectional sketch of an array of light emitters 10 and light detectors 12 in close juxtaposition with each other for optical communication therebetween. In the present example, light emitters E1, E2, E3, E4, . . . may be laser diodes, for example, which are operative to emit respectively corresponding laser beams B1, B2, B3, B4, . . . in the direction of the detector array 12, which may be on the order of a few thousandths of an inch away, for example, to illuminate spot areas on the surface 14 thereof. If the emitters E1, E2, E3, E4, . . . are well aligned with a respectively corresponding set of light detectors D1, D2, D3, D4, . . . such as shown in the example of FIG. 1, then the spot illuminations from the light beams B1, B2, B3, B4, . . . will fall on the detectors D1, D2, D3, D4, . . . , respectively, and optical communication channels may be formed between the emitter/detector pairs E1/D1, E2/D2 and so on.

Figure 2:
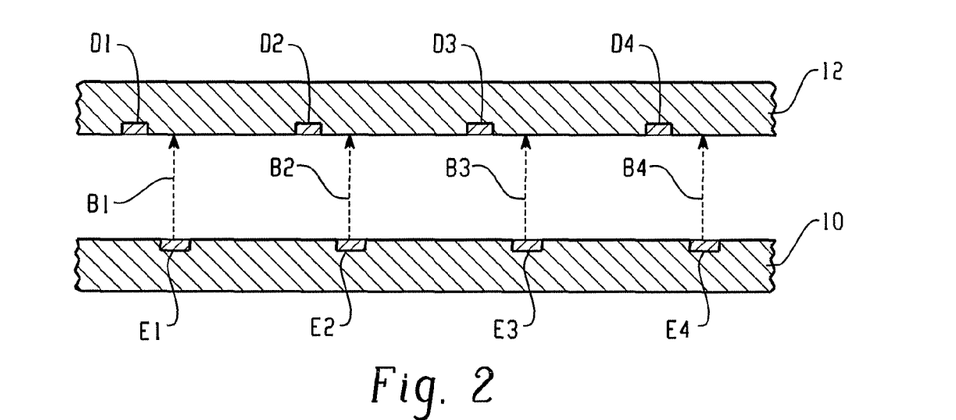
FIG. 2 is a cross-sectional sketch of an exemplary array of light emitters and light detectors in close juxtaposition with each other showing the light detectors misaligned with the light emitters.

Note that in the present example, each of the light emitters of array 10 emit a beam of light in a single direction, preferably transverse to the plane of the array 12. Thus, if the emitters E1, E2, E3, E4, . . . of the array 10 are misaligned with the detectors D1, D2, D3, D4, . . . such as shown in the example of FIG. 2 (somewhat exaggerated), then the light beams B1, B2, B3, B4, . . . emitted respectively from the emitters E1, E2, E3, E4, . . . may not illuminate some of the detectors D1, D2, D3, D4, . . . of the array 12. Accordingly, the number of optical communication channels which may be formed between arrays 10 and 12 will be commensurate with the number of light beams B1, B2, B3, B4, . . . that effectively illuminate detectors D1, D2, D3, D4, . . . of the array 12.

Figure 3:
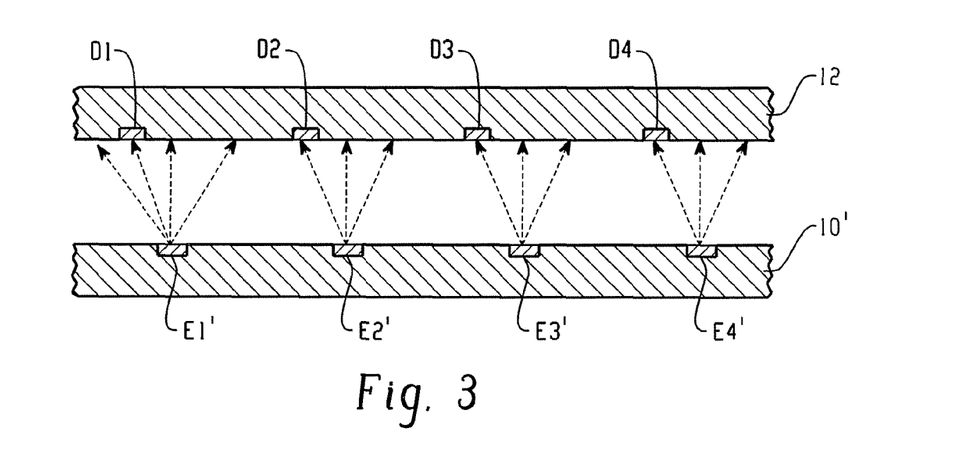
FIG. 3 is a cross-sectional illustration of an exemplary embodiment of one aspect of the present invention in which a controllably steerable light beam is emitted from each emitter section of an array of light emitter sections and directed toward an array of light detectors.

The present invention reduces the need to have precise alignment between the emitters and the detectors of arrays 10 and 12 in order to optimize the number of optical communication channels which may be formed therebetween. Rather than have a light beam emitted in a single direction for alignment with a light detector, the present invention provides for a controllably steerable light beam emitted from emitter sections E1', E2', E3', E4' . . . of an emitter array 10' as shown in the cross-sectional illustration of FIG. 3. Referring to FIG. 3, each light beam, which is designated by the dashed, arrowed lines, emitted from an emitter section of the emitter array E1', E2', E3', E4' . . . may be controllably steerable through a multiplicity of emission angles with respect to the surface of the array 10' so that the probability of illuminating a detector of the array 12 at least one emission angle of the multiplicity is substantially increased without precise alignment of the arrays 10' and 12. In order to determine the emission angle of the light beam that illuminates a detector for each of the emitter sections E1', E2', E3', E4' . . . , the present invention also provides for a training process for configuring the arrays 10' and 12 into optical communication channels as will become more evident from the description found herein below.

Figure 4:
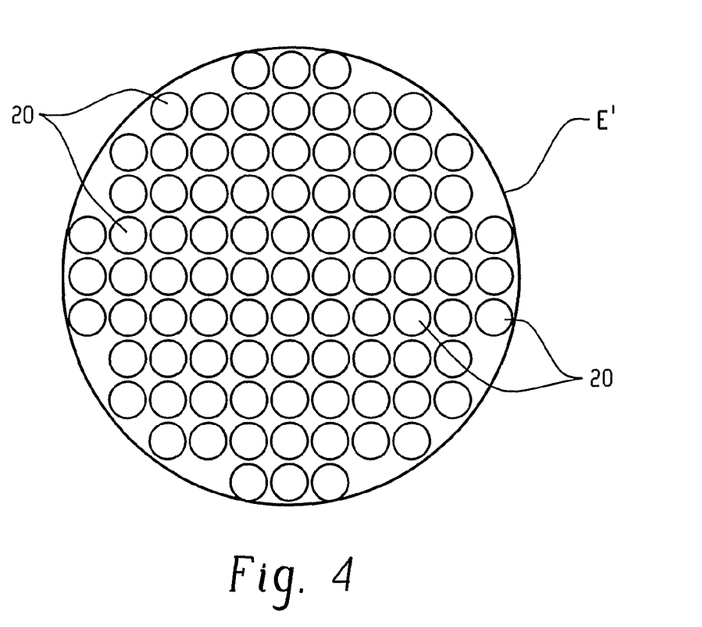
FIG. 4 is a top view of an exemplary emitter section embodiment suitable for use in the embodiment of FIG. 3.

More specifically, in one embodiment, each light emitter section of the emitter sections E1', E2', E3', E4' . . . comprises a steerable group of laser diodes, which may be low-power, vertical cavity surface emitting laser (VCSEL) diodes, for example, that emit beams of coherent light at different angles of emission. FIG. 4 is a top view of an exemplary emitter section E' of the array 10'. Referring to FIG. 4, a multiplicity of laser diodes 20 is formed on a surface of array 10' in a grouping shown within a circled line which is representative of a surface area section of the exemplary emitter E'.

The laser diodes 20 of the emitter section E' are configured to emit laser beams with different angles of emission with respect to the surface of array 10'. Accordingly, the laser diodes 20 of each emitter section may be designed to emit laser beams in the direction of a desired detector of array 12 in order to effect an optical communication channel without precise alignment between emitter and detector. This design may be accomplished by fabricating the VCSEL diodes 20 at different angles of emission in a semiconductor process, for example. Note that each emitter section E' of array 10' may be controlled to steer a laser beam to different points of the detector array 12 by applying signals individually and selectively to the group of laser diodes thereof.

Figure 5:
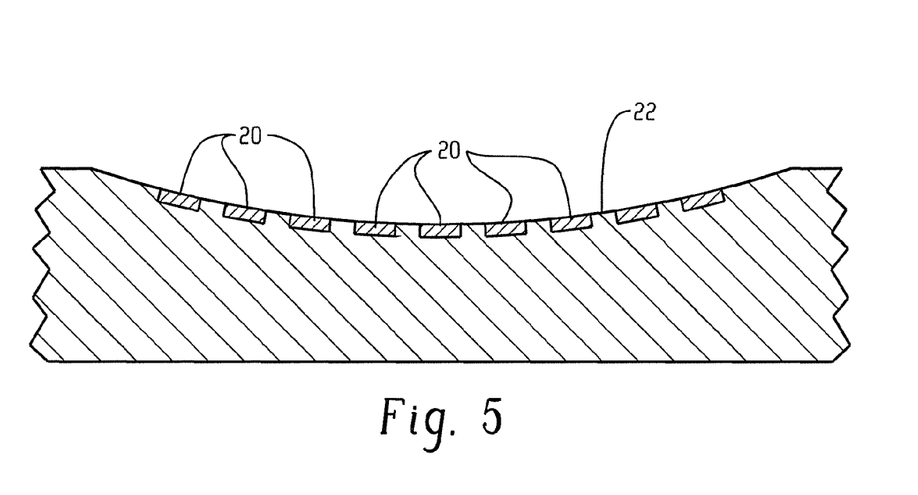
FIG. 5 is a cross-sectional illustration of an exemplary row or column of a group of laser diodes fabricated on a concave shaped emitter section.

In the present embodiment, each emitter section E1', E2', E3', E4' . . . of the array 10' may be fabricated on a semiconductor substrate, for example, as a concave surface 22 such as shown by way of example in the cross-sectional illustration of FIG. 5. The illustration of FIG. 5 is exemplary of the cross-section of a row or column of the group of laser diodes 20. Note that by way of construction each of the laser diodes 20 of each emitter section E1', E2', E3', E4' . . . of the array 10' may emit its laser beam, upon selection, toward a spot on the surface of the array 12 as shown in the exemplary cross-sectional illustration of FIG. 6.

Figure 6:
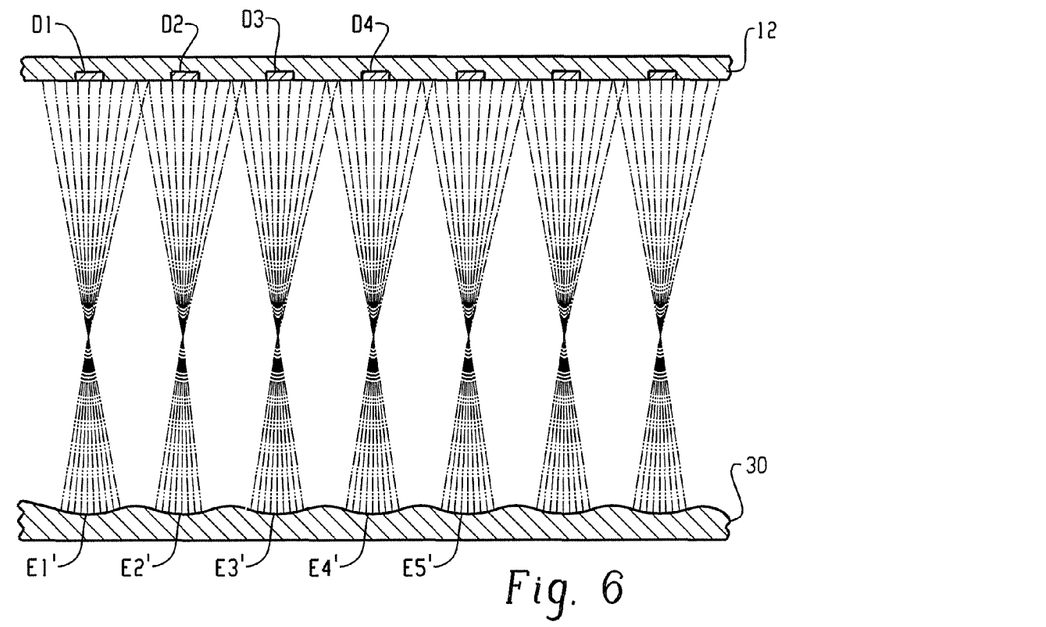
FIG. 6 is a cross-sectional illustration depicting an exemplary row of emitter sections with concave surfaces fabricated on a substrate with each section including a group of laser diodes arranged on the concave surface area to emit their laser beams from different emission angles towards an aligned detector array.

Referring to FIG. 6, the cross-sectional illustration depicts an exemplary row of emitter sections E1', E2', E3', E4' . . . with concave surfaces fabricated on a substrate 30, each section including a group of laser diodes 20 arranged on the concave surface area to emit their laser beams, upon selection, from different emission angles toward the detector array 12. The solid lines emanating from each section E1', E2', E3', E4' . . . in FIG. 6 represent the line beams at the multiplicity of emission angles. In the example of FIG. 6, the number of detectors in the array 12 are slightly in excess of the number of emitter sections of array 10' and the detectors D1, D2, D3, D4 . . . are well aligned approximately over respectively corresponding emitter sections E1', E2', E3', E4' . . . of the array 10'. However, it is understood that a positioning of the detector array 12 with respect to the emitter section array 10' may not always result in such an emitter/detector alignment.

Figure 7:
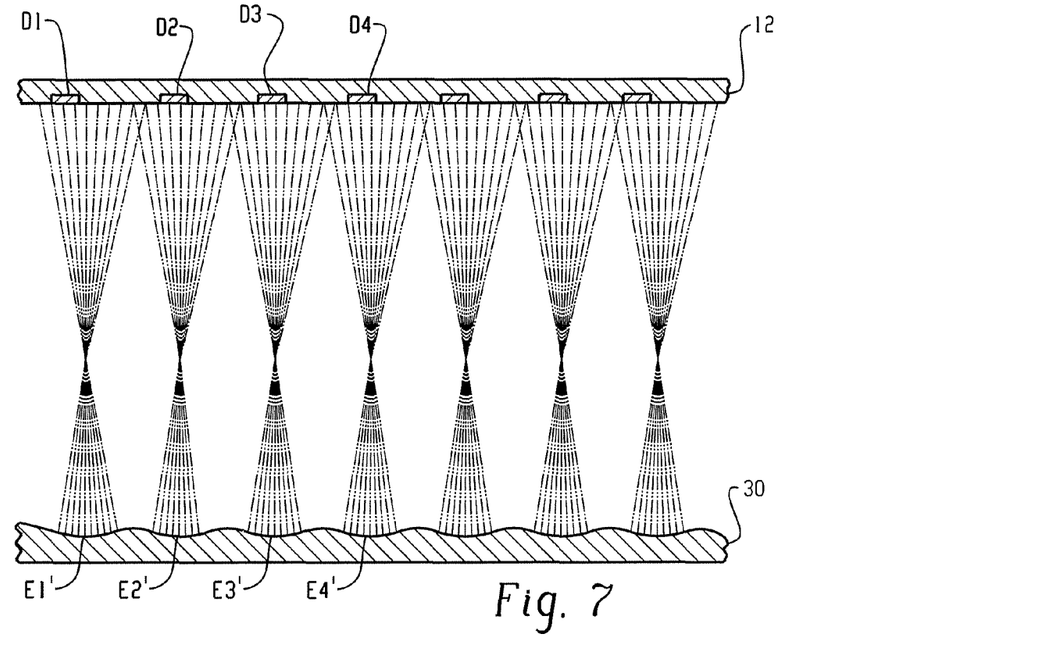
FIG. 7 is a cross-sectional illustration depicting an exemplary row of emitter sections with concave surfaces fabricated on a substrate with each section including a group of laser diodes arranged on the concave surface area to emit their laser beams from different emission angles towards a misaligned detector array.

For example, the detectors D1, D2, D3, D4 . . . of array 12 may be aligned with an X-Y offset to the emitter sections E1', E2', E3', E4' . . . of the array 10' as shown in the cross-sectional illustration of FIG. 7. FIG. 7 illustrates a case in which a sparsely populated array of detectors which are offset to the emitter sections may be compensated by the steerable beams of the emitter sections as shown by the emanating solid lines. Note that at least one emission angle of each steered beam (solid line) of an emitter section illuminates (intersects) one of the detectors D1, D2, D3, D4 . . . of array 12. Accordingly, the detectors of array 12 may be only roughly aligned with the emitter sections of array 10' in order for the present invention to be effective.

Figure 8:
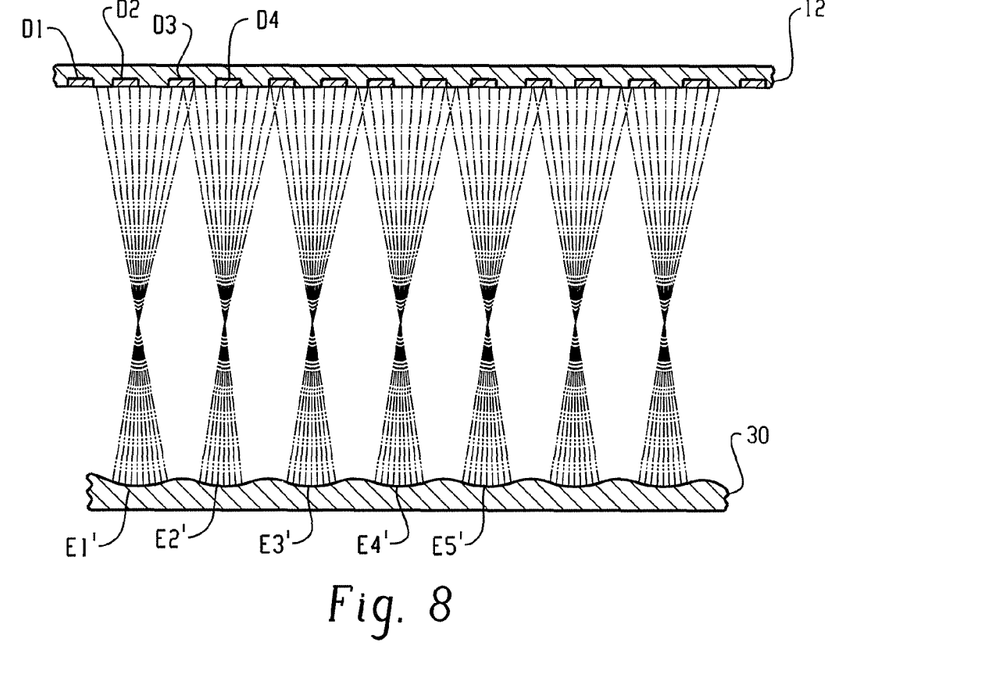
FIG. 8 is a cross-sectional illustration depicting an exemplary row of emitter sections with concave surfaces fabricated on a substrate with each section including a group of laser diodes arranged on the concave surface area to emit their laser beams from different emission angles towards a detector array including a greater number of detectors than emitter sections.

It is understood that the illuminating spot areas of laser energy steerably emitted by an emitter section of the array 10' may be made as large or as small as desired. However, if the illuminating spot area is made too small, it may reduce the probability of at least one of the spot areas of laser energy steered from an emitter section of array 10' falling on a sparsely populated array of detectors which will reduce the number of effective optical communication channels configured in a training phase as will become more evident from the following description. Of course, this probability may be increased by increasing the number of detectors per given area of the array 12 as shown by the cross-sectional illustration of FIG. 8. In the example of FIG. 8, there are many more detectors in the array 12 than would be used for a 1:1 mapping of emitters to detectors, thereby increasing the probability of an illumination of a detector by at least one of the angles of emission of each of the emitter sections in array 10', notwithstanding a relatively small illuminating spot area.

Figure 9:
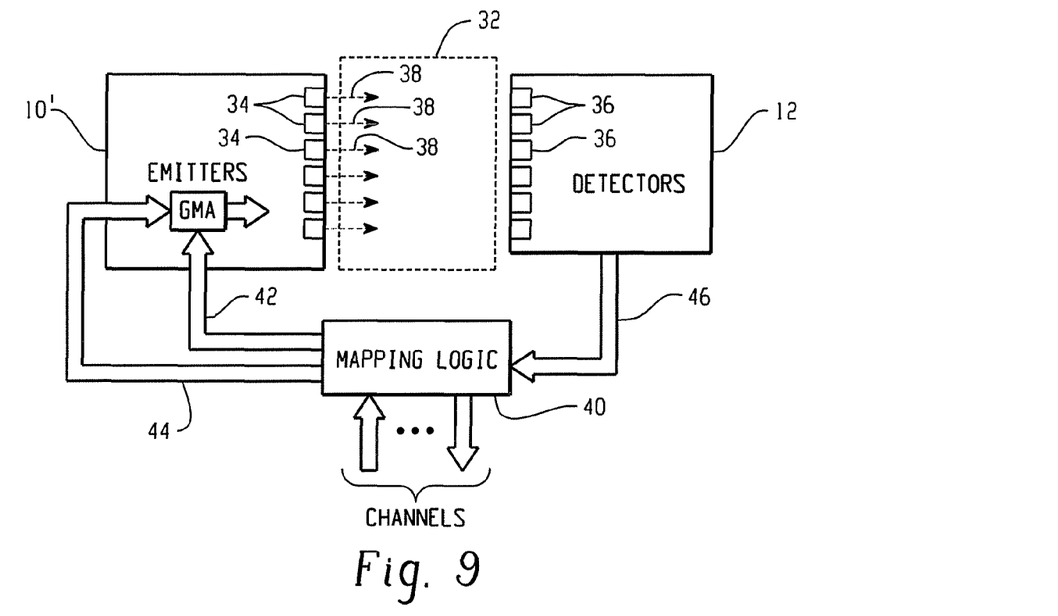
FIG. 9 is a block diagram schematic of an exemplary training phase arrangement suitable for embodying another aspect of the present invention.

Thus, once a rough alignment between arrays 12 and 10' is established, arrays 12 and 10' may undergo a "training phase" to identify a detector in the array 12 with the best coupling to an emitter section of the array 10'. A block diagram schematic of an exemplary training phase arrangement is shown in FIG. 9. Referring to FIG. 9, the arrays of light emitters and light detectors are denoted by the blocks 10' and 12, respectively, and the thin spacing therebetween, which may be only a few thousandths of an inch, for example, is denoted by the dashed line block 32. The sub-blocks 34 within the array block 10' represent individual laser emitter group sections E1', E2', E3', . . . thereof and the sub-blocks 36 within the array block 12 represent individual light detectors thereof. Note that FIG. 9 is merely illustrative of the training phase arrangement and not drawn to scale. It is understood that there would preferably be a larger number of detectors 36 per given area in array 12 than emitter sections 34 in array 10' to increase the probability of a steered beam spot area illuminating, either partially or fully, a detector of array 12.

Accordingly, when each of the laser diodes of an emitter section 34 of array 10' is selectively energized, it emits a laser beam at a predetermined angle of emission denoted by an arrowed line 38. By selectively energizing the laser diodes of an emitter section 34, the resultant laser beams 38 are steered through the spacing 32 and illuminate respective spot areas of the array 12. In the present embodiment, a logic controller 40 which may comprise a programmed processor, for example, is provided for optical channel configuration as will become more evident from the following description. The controller 40 functions as mapping logic to establish laser diode/detector pairs for optical communication channels for wide bandwidth optical communication between arrays 10' and 12.

The controller 40 may be coupled by signal lines 42 through a suitable switching array, like a gate matrix array (GMA), for example, to the laser diodes of each of the sections 34 of the array 10' for the selective electrical energization thereof. Each signal line of lines 42 may correspond to a laser diode of each emitter section 34 of the emitter array 10'. In addition, signal lines 44 from controller 40 are coupled to the switching array or GMA to select an emitter group of laser diodes to be controlled by the signal lines 42. Accordingly, once an emitter group is selected by the signal lines 44, the signal lines 42 may be controlled to selectively energize the laser diodes of the selected emitter section 34 to cause the steering of the laser beam emission 38 thereof. Similarly, the controller 40 may be coupled by signal lines 46 to each of the individual detectors 36 of the array 12. Thus, the controller 40 may selectively control the laser beam steering of each of the emitter sections 34 through the spacing 32 to illuminate spot areas on the array 12, and may monitor onto which detectors 36 the illuminated spot areas fall and the magnitude of laser energy received by each.

Accordingly, the controller 40 may map an appropriate detector 36 for each emitter section 34 to configure an optical communication channel using a suitable algorithm which may be programmed therein and executed thereby. It is understood that not all of the emitter sections 34 of the array 10' may be mapped to a detector 36 and thus, the number of communication channels configured by controller 40 may be less than the number of emitter sections 34 in the array 10'. Once the training process is complete, the mapped emitter/detector pairs may be used as optical communication channels for unidirectional data transfers between arrays 10' and 12.

Figure 10A:
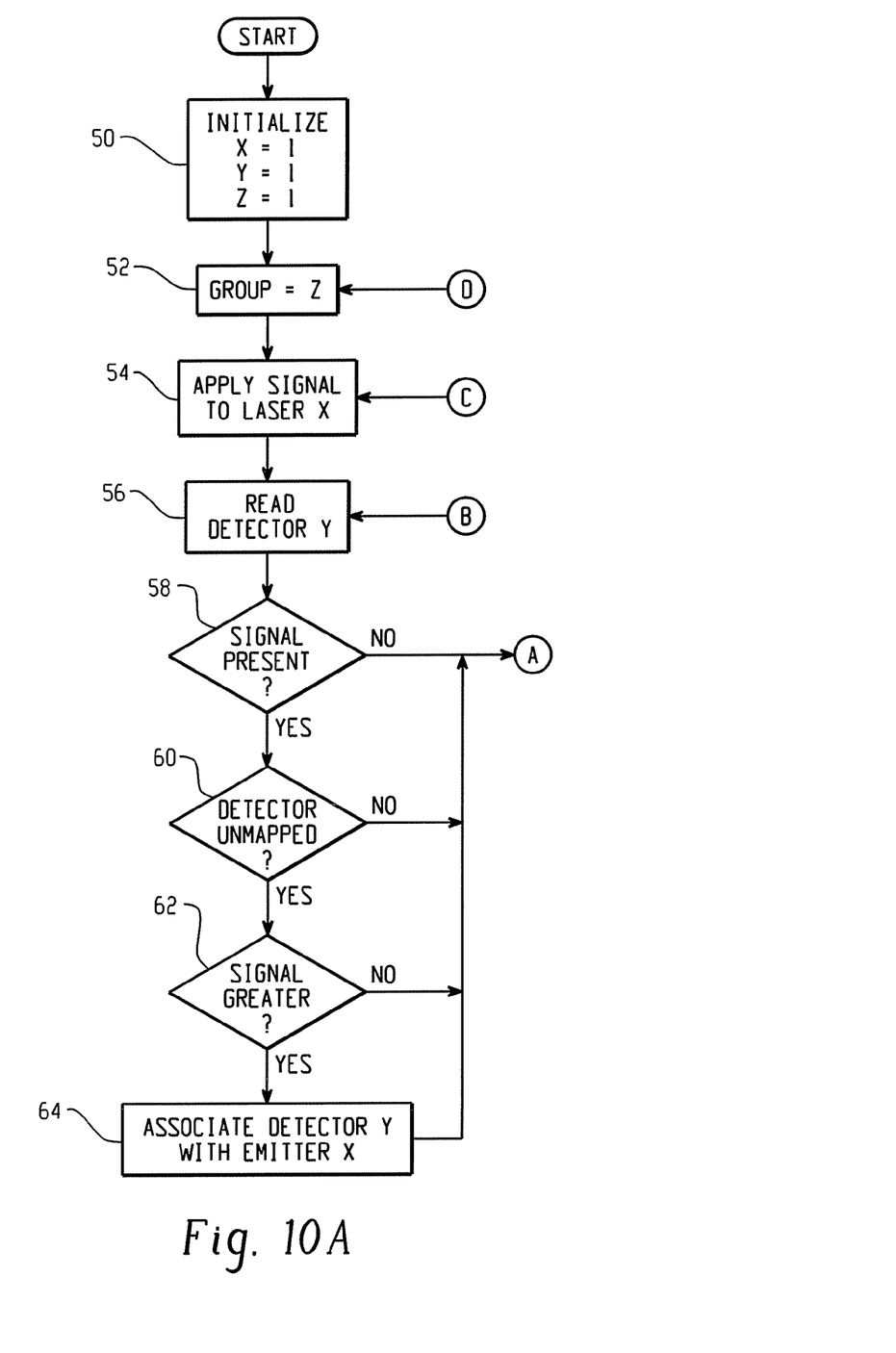
FIGS. 10A and 10B collectively depict a flowchart of a suitable algorithm for use as a training process in configuring optical communication channels by the training phase arrangement of FIG. 9.
Figure 10B:
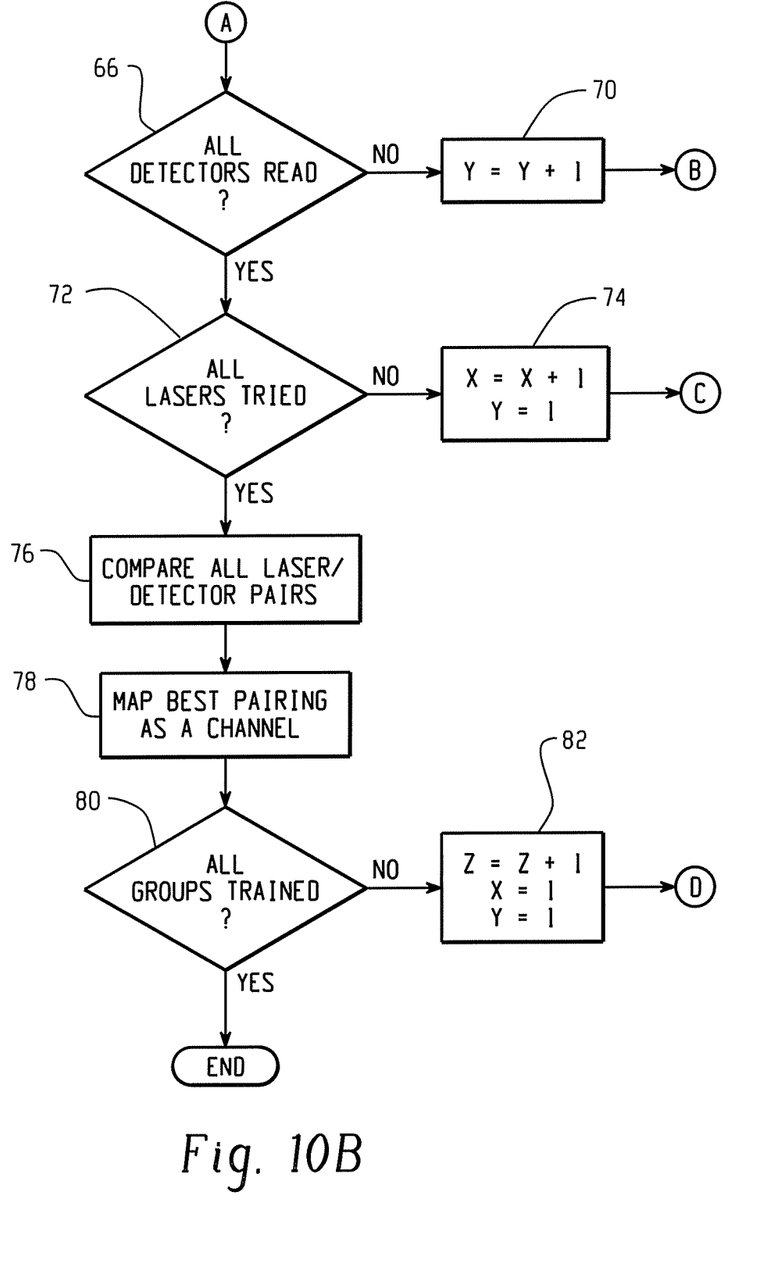

A suitable algorithm for use as a training process by the programmed controller 40 in configuring the optical channels is shown in the flowchart of FIGS. 10A and 10B. Each block of the flowchart represents one or more steps of the algorithm. Referring to the flowchart of FIGS. 10A and 10B, the channel configuration process starts at step 50 wherein an initialization process is performed. As part of the initialization, the emitter sections 34, the laser diodes thereof, and detectors 36 may be numbered consecutively in some convenient manner. For example, if the emitter groups of sections 34 are formed in rows and columns, then the emitter sections 34 may be numbered consecutively from left to right starting with the top or first row and descending row to row to the bottom or last row. Thus, if there are 13 rows and 13 columns in the example, the emitter section in the upper most left hand corner of the array will be numbered 1 and the emitter section in the lower most right hand corner will be numbered 169. The same numbering process may be performed by block 50 for the laser diodes of each group or emitter section (see FIG. 4), and the detectors 36 which may also be configured in rows and columns, for example. Also in block 50, the process may set the starting emitter group number Z, the laser diode number X of the emitter group number Z and detector number Y to one.

In the next block 52, the signal line of lines 44 corresponding to the emitter group Z is selected by processor 40, and a signal is applied to the signal line of lines 42 corresponding to the laser diode X of emitter group Z in block 54. In the execution of following blocks 56-70, the detectors 36 of array 12 are sequentially scanned by the processor 40 to find an unmapped detector onto which the spot illumination of the laser beam of emitter X falls. Should spot illumination fall partially onto more than one unmapped detector, then the detector with the best match is associated with laser diode X of group Z.

More specifically, the signal over the signal line of lines 46 corresponding to the detector Y is read in by the processor 40 in block 56. Next, in the decisional block 58, it is determined whether or not an appropriate amount of laser energy is received by detector Y. This may be accomplished in the present embodiment by comparing the laser energy magnitude of detector Y to a minimum threshold. If the received laser energy value of detector Y exceeds the minimum threshold, then execution continues at block 60 wherein it is determined if the detector Y is unmapped, i.e. not already mapped to another laser diode. If unmapped, the magnitude value may be stored in a designated register of a memory of processor 40. The memory of processor 40 may include a set of registers correspondingly designated to the laser diodes of each group of array 10', for example. Accordingly, each designated register may store the signal magnitude and corresponding detector from which it is read.

Next, in block 62, present signal value of detector Y is compared to a signal value previously determined to be greatest from another detector. Of course, if there were no previously determined values, then the present value would be the greater by default. If the present signal value is determined to be greater by default or otherwise, then in block 64 the corresponding detector Y is associated with the laser diode X, i.e. stored in the designated register(s). After execution of block 64 or if the decisions of any of the decisional blocks 58, 60 or 62 is negative, execution continues at block 66.

In block 66, it is determined if all of the detectors of the array 12 have been scanned. If not, then detector number Y is incremented by one in block 70 and the program continues to loop through blocks 56 to 70 until all of the detectors have been scanned for laser diode X. If a detector match is determined during the scan, then the corresponding detector number and signal magnitude may be stored (association) in the designated register for laser X. Once a detector scan is complete as determined by block 66, then the next laser diode of group Z in consecutive order is selected in block 74, the selected laser diode is energized in block 54, and another detector scan is performed by the execution of blocks 56-70. The process continues until all of the laser diodes of the group Z have been selectively energized and a scan of detectors performed for each. The designated registers of the processor 40 may store any detector hits during the scan of laser diodes of group Z and the corresponding signal magnitudes.

Once a laser diode scan of group Z is completed as determined by block 72, the laser diode/detector pairing are compared with each other to determine the best pairing in block 76 and the best laser diode/emitter pairing is mapped as an optical communication channel in block 78. This may be accomplished in the present embodiment, by comparing the signal magnitude values of each pairing and selecting the greatest signal value as the best pairing. It is understood that in some circumstances, the scan of emitters of a group, which effects a steering of the laser beam emitted by such group or emitter section of array 10', may not result in a detector hit, and therefore, no communication channel may be mapped for that emitter section. Accordingly, not all of the emitter sections of array 10' may be configured as a communication channel with a detector of the array 12.

Once blocks 76 and 78 have been performed for a group Z, it is determined in block 80 if all of the groups of the array 10' have been trained. If not, the next group in consecutive order is set by block 82 and the scan of the laser diodes for the selected group is repeated by executing blocks 54-78 to configure a communication channel for the selected group or emitter section. Once all of the emitter sections of the array 10' have been trained as determined by block 80, then the training may end.

The foregoing described training process selected a laser diode of a group and scanned the detectors of the detector array to determine a best match between the selected laser diode and a detector and then, continued to repeat the process for each laser diode of each group to form optical channels from the determined laser diode/detector pairs. It is understood that the present invention is not limited to this training process and that other training processes may be used without deviating from the broad principles of the present invention. For example, a training process which selects a detector of the detector array and scans the laser diodes of each of the emitter groups to determine a best match, and then repeats the process for each detector of the detector array will work just as well to form the optical channels between the arrays 10' and 12.

In addition, should the training process fail for whatever reason, even after repeated steps to train are attempted, then the controller may suspend training operations and report an error which may result in a manual re-positioning of the arrays with respect to each other. Once the arrays are re-positioned, the process of training may be repeated as described herein above.

Figure 11:
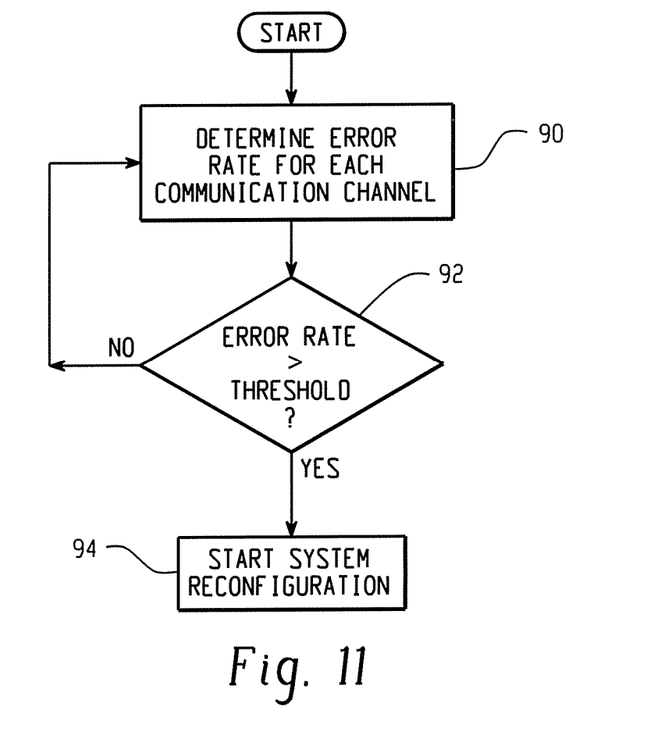
FIG. 11 is a flowchart of method steps of an exemplary dynamic reconfiguration process suitable for embodying another aspect of the present invention.

Once the training or configuration process is complete, data communication over the established optical communication channels may commence. During normal system operation, it may be determined dynamically when to reconfigure the optical communication channels. In the present embodiment, this dynamic reconfiguration process is achieved through use of method steps shown by way of example in the flowchart of FIG. 11. Referring to FIG. 11, the method starts at block 90 wherein an error rate is established for each optical channel. This may be accomplished in the present embodiment through use of conventional error detection and correction (EDAC) techniques. For example, each time an error is detected in a channel, an error count in a designated memory register for that channel is incremented. Thus, an error rate may be determined by monitoring differences in count corresponding to predetermined intervals of time.

When an error rate for a channel is determined to exceed a predetermined threshold by block 92, then the process initiates a channel reconfiguration in block 94 which may be accomplished by re-executing the flowchart of FIGS. 10A and 10B, for example. The reconfiguration process will continue to measure and monitor the error rates of the optical channels in block 90, if no channel exhibits an excessive error rate. Also, once a channel reconfiguration initiated by block 94 is complete, the process will continue at block 90.

In summary, one embodiment of the present invention provides for a group of laser diodes for each emitter section wherein the laser diodes of each section are fabricated to emit laser beams with different angles of emission with respect to the surface of the emitter section array 10'. In another embodiment, the laser diodes of each emitter section are fabricated on a concave shaped surface and are energized selectively to steer the emitted laser beams to sequentially illuminate the array of detectors 12 with differently located spot areas of laser energy. Accordingly, the array of detectors 12 may be roughly aligned with the emitter section array 10' so that the steered emitted beams of laser energy of each emitter section illuminate spot areas on the detector array 12.

Once the emitter and detector arrays are in rough alignment with each other, a training process is performed for mapping laser diode/detector pairs based on received laser energy to establish multiple optical communication channels for data communications between arrays without precise alignment of the arrays to each other. In addition to the initial configuration of the optical communication channels, the error rate of each configured channel may be measured during normal operation of the system and when an observed error rate of a channel exceeds a predetermined threshold, the system may undergo a reconfiguration to establish new, possibly more reliable, optical communication channels. In this manner, the system maintains a low error rate among configured channels.

Figure 12:
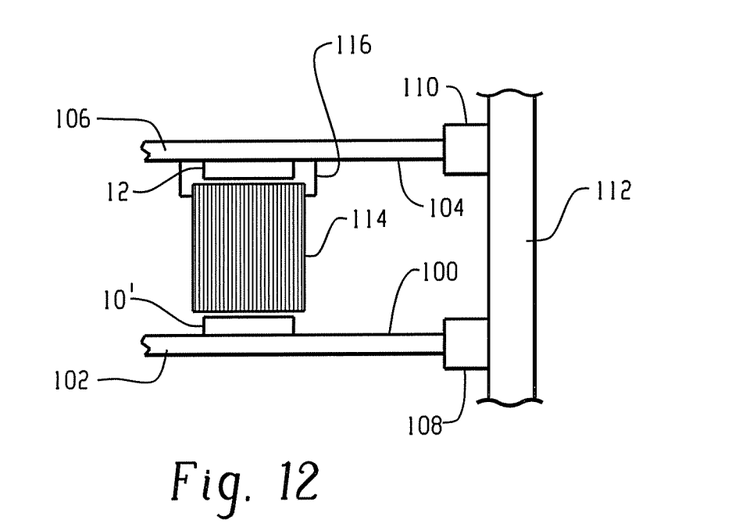
FIG. 12 is an illustration of an embodiment of yet another aspect of the present invention in which a cable of optical fibers is disposed between an array of emitter sections on one PC board and an array of detectors on another PC board.

While the foregoing described embodiment is effective to configure optical communication channels between arrays of emitter sections and detectors juxtaposed closely to each other, extending the optical interface between arrays to greater spacing, like between printed circuit (PC) boards, for example, may alter the effectiveness of configuring such optical channels for optical data communication between PC boards. A solution to this drawback may be to introduce a cable of optical fibers between the arrays as shown in the illustration of FIG. 12. Thus, the spacing between an array and the optical fiber cable may be kept small and the optical channels may be formed through the cable of optical fibers.

Referring to the embodiment of FIG. 12, the array of emitter sections 10' as described herein above may be disposed on a side 100 of a PC board 102 and the array of detectors 12 as described herein above may be disposed on a side 104 of another PC board 106. Sides 100 and 104 are facing each other. PC boards 102 and 106 may be slid into respective connectors 108 and 110 of a mother board or backplane to form a parallel arrangement, i.e. side 100 being substantially parallel to side 104. A cable of optical fibers 114 is disposed between the arrays 10' and 12 for forming optical channels therebetween. In the present embodiment, the optical fibers of cable 112 are in a 1:1 relationship with the detectors of array 12. A mechanical arrangement 116 located at the PC board 106 may secure one end of the cable 114 in close proximity to the detector array 12 in such a manner that the optical fibers of cable 114 are aligned substantially with the detectors of the detector array 12 as shown by the cross-sectional illustration of FIG. 14.

Figure 13A:
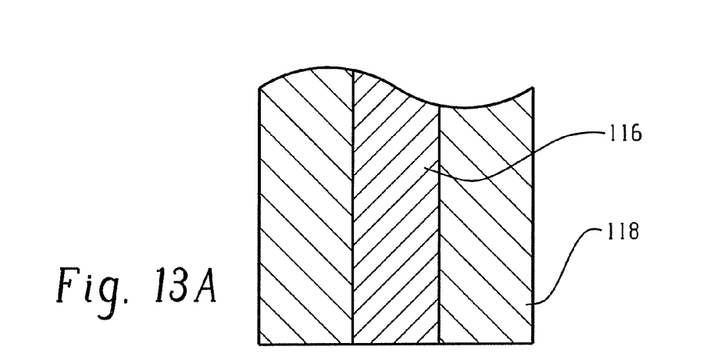
FIGS. 13A and 13B are cross-sectional and top view illustrations of an exemplary optical fiber suitable for use in the embodiment of FIG. 12.
Figure 13B:
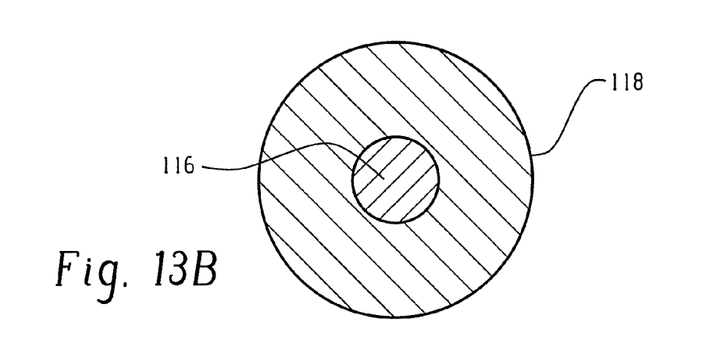

FIGS. 13A and 13B are side and top view illustrations, respectively, of a typical optical fiber for use in the cable 114. Referring to FIGS. 13A and 13B, each optical fiber of the cable 114 comprises an inner core 116 through which light is conducted and an outer protective cladding and jacket 118, collectively referred to hereafter as cladding. Optical fibers are specified by acceptance angle, core diameter, and cladding diameter. Generally, the ratio of the core diameter to cladding diameter is approximately one to three. In other words, the core diameter is about one-third of the cladding diameter. The acceptance angle is that angle of incidence within which light will enter the optical fiber core. Light impinging on the optical fiber cross-section at an incidence angle greater than the acceptance angle will be reflected and not enter the optical fiber core. The relevance of the acceptance angle of the optical fibers will become more evident from the following description.

Figure 14:
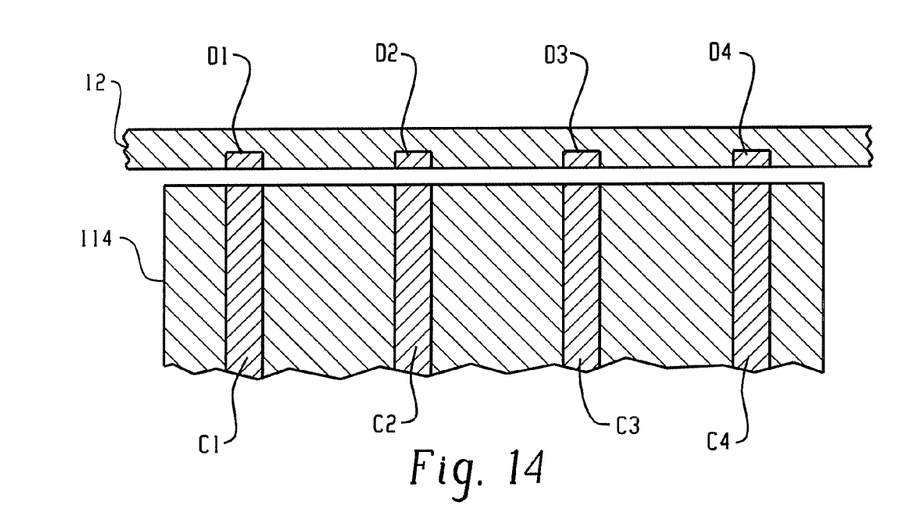
FIG. 14 is a cross-sectional illustration showing optical fibers of a cable aligned substantially at one end with detectors of a detector array.

FIG. 14 is an expanded, cross-sectional illustration of the fixed alignment of cable 114 with the detector array 12 shown in FIG. 12. Referring to FIG. 14, each of the optical fibers of the cable 114 has its core C1, C2, C3, C4, . . . aligned over a respectively corresponding detector D1, D2, D3, D4, . . . of the detector array 12. Thus, in the present embodiment, light exiting each optical fiber of the cable 114 will impinge directly on its corresponding detector of the array 12.

Referring back to FIG. 12, the other end of cable 114 is aligned with the emitter section array 10' on PC board 102. In the present embodiment, this alignment may occur when board 106 is first connected to backplane 112 via connector 110 and board 102 is slid into connector 108 or vice versa. A suitable optical fiber cable connection interface between boards 102 and 106 will accommodate a rough alignment between the optical fibers of cable 114 and the emitter sections of array 10'.

Figure 15:
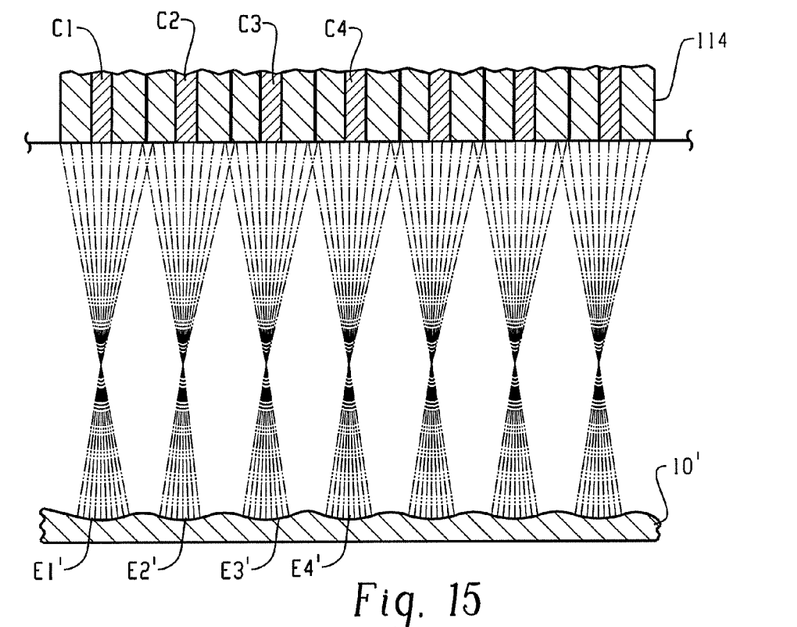
FIG. 15 is a cross-sectional illustration depicting an exemplary row of emitter sections with concave surfaces fabricated on a substrate with each section including a group of laser diodes arranged on the concave surface area to emit their laser beams from different emission angles towards a cable of aligned optical fibers.
Figure 16:
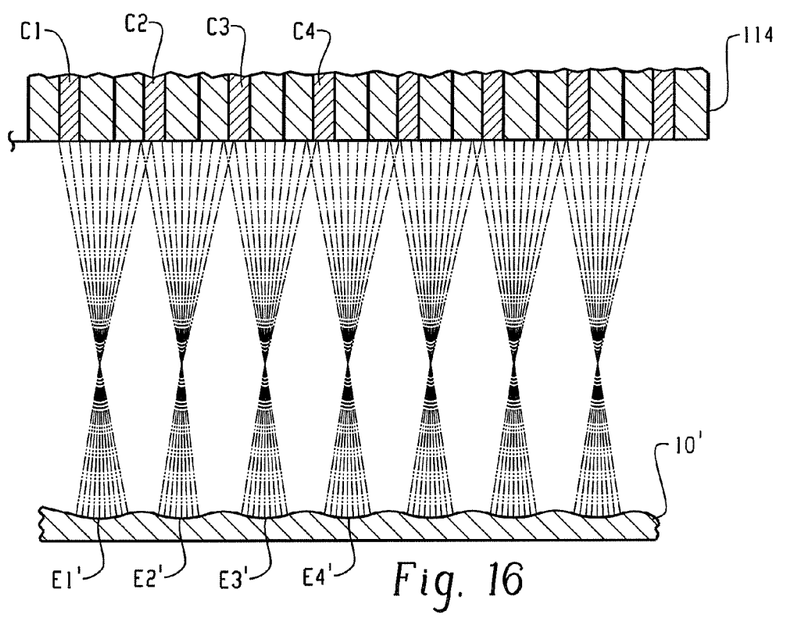
FIG. 16 is a cross-sectional illustration depicting an exemplary row of emitter sections with concave surfaces fabricated on a substrate with each section including a group of laser diodes arranged on the concave surface area to emit their laser beams from different emission angles towards a cable of misaligned optical fibers.
Figure 17:
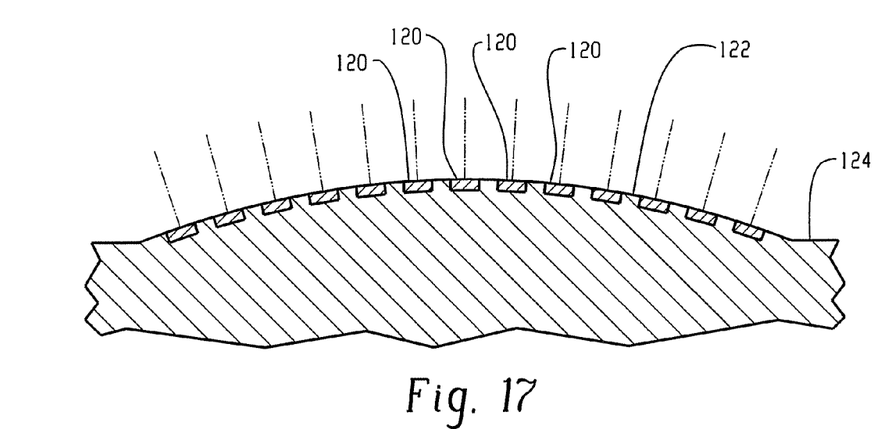
FIG. 17 is a cross-sectional illustration of an alternate embodiment of an aspect of the present invention in which an exemplary row or column of a group of laser diodes are shown fabricated on a convex shaped emitter section.

FIG. 15 is an expanded, cross-sectional illustration of a well-aligned interface between the emitter sections E1', E2', E3', E4', . . . of array 10' and the optical fibers of cable 114 and FIG. 16 depicts a similar illustration with a poorly aligned emitter section/optical fiber interface. Since the optical fibers of cable 114 are fixedly aligned with the detectors D1, D2, D3, D4, . . . of the array 12 (see FIG. 14), then light entering the core of an optical fiber at the emitter array end will fall directly on a corresponding detector of array 12. At the emitter array end of cable 114, the optical fibers do not have to be well aligned with the emitter sections E1', E2', E3', E4', . . . of array 10' because the laser beams of each array section are steered in a multiplicity of different emission angles as shown by the solid lines in FIGS. 15 and 16 so that there is a substantial probability of one of the steered emission angles of each emitter section falling within the acceptance angle of an optical fiber of cable 114 and thus, impinging directly on the corresponding detector of array 12.

Once the emitter array end of the cable 114 is aligned with the array 10' as shown by the examples of FIGS. 15 and 16, a similar training process as described above in connection with the embodiments of FIGS. 9, 10A and 10B may be performed to configure optical channels between arrays 10' and 12 using the optical fiber cable 114 in order to establish optical communication between PC boards 102 and 106 (see FIG. 12). Once the training or configuration process is complete, data communication between PC boards over the established fiber optic communication channels may commence. During normal system operation, it may be determined dynamically when to reconfigure the optical communication channels. In the present embodiment, this dynamic reconfiguration process may be achieved through use the method steps described herein above in connection with the flowchart of FIG. 11.

While the present embodiment has been described in connection with unidirectional data communication between arrays 10' and 12, it is understood that the same principles may apply to bidirectional data communication by disposing another array of emitter sections at the side of detector array 12 and a corresponding array of detectors at the side of emitter array 10'. An optical fiber cable may be provided between the second set of arrays depending on the spacing therebetween. The optical communication channels for data communication between the second set of arrays may be configured and dynamically reconfigured through use of the use of the same or similar processes as that described herein above in connection with the embodiments of FIGS. 9, 10A, 10B and 11, for example. Thus, once configuration of the optical channels of the second set of arrays is established, then bidirectional data communications may commence using the established optical communication channels for each direction.

While the present embodiment has been described in connection with unidirectional data communication between arrays 10' and 12, it is understood that the same principles may apply to bidirectional data communication by disposing another array of emitter sections at the side of detector array 12 and a corresponding array of detectors at the side of emitter array 10'. An optical fiber cable may be provided between the second set of arrays depending on the spacing therebetween. The optical communication channels for data communication between the second set of arrays may be configured and dynamically reconfigured through use of the same or similar processes as that described herein above in connection with the embodiments of FIGS. 9, 10A, 10B and 11, for example. Thus, once configuration of the optical channels of the second set of arrays are established, then bidirectional data communications may commence using the established optical communication channels for each direction.

Figure 18:
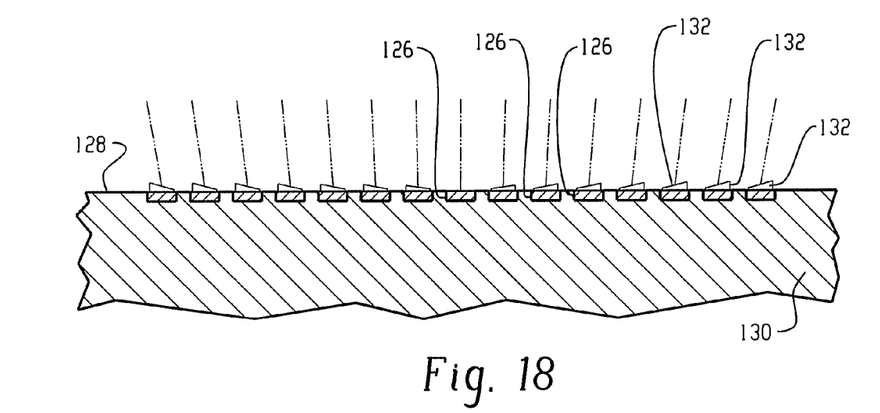
FIG. 18 is a cross-sectional illustration of another alternate embodiment of an aspect of the present invention in which an exemplary row or column of a group of laser diodes is shown fabricated on a substantially flat surface of a substrate with individual optical elements disposed over each diode.

In a further embodiment, a steered laser beam from an emitter section may be effected by fabricating an optical element, like a micro wedge shaped prism, for example, may be fabricated on top of each laser diode of an emitter section as shown in the illustration of FIG. 18. In this embodiment, the laser diodes 126 of an emitter section are fabricated on a flat surface 128 of a substrate 130 and individual micro wedge prisms 132 are fabricated on top the laser diodes 126. Accordingly, laser beams emitted from the diodes 126 that would otherwise be emitted substantially perpendicular to the flat surface 128 are directed towards the tall end of the corresponding wedge shaped prism at an angle away from the surface normal.

Note that in the present embodiment, no prism is disposed over the center laser diode of the emitter section because the laser beam emitted from the center laser diode is intended to be substantially perpendicular to the surface 128. The prisms 132 may be fabricated with different sizes to effect laser beams emitted from the laser diodes of the emitter section at different emission angles. In the embodiment of FIG. 18, the micro wedges 132 are sized proportional to the distance away from the center of their corresponding laser diodes 126. Accordingly, the laser diodes 126 of an emitter section closer to the center will emit laser beams at emission angles closer to the surface normal than those laser diodes 126 farther from the center as shown by straight lines in FIG. 18. By selectively controlling the laser diodes of an emitter section, a laser beam may be steered by the micro wedges without any moving parts.

Figure 19:
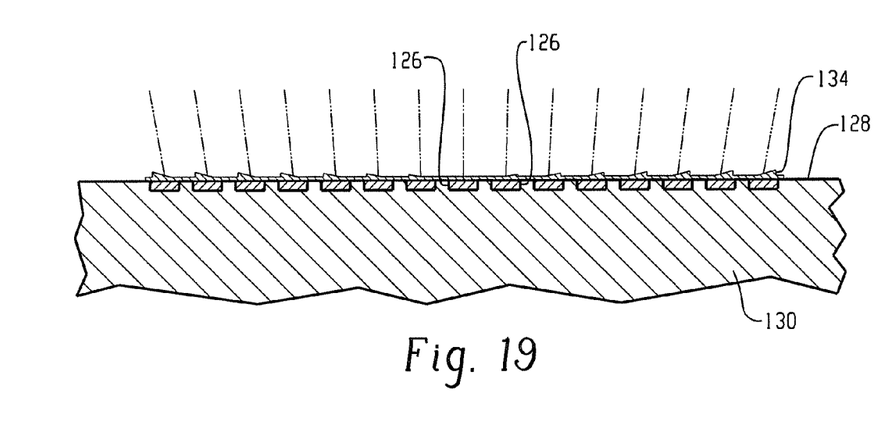
FIG. 19 is a cross-sectional illustration of yet another alternate embodiment of an aspect of the present invention in which an exemplary row or column of a group of laser diodes are shown fabricated on a substantially flat surface of a substrate with optical elements configured in a layer disposed over and aligned with the diodes.

While the embodiment of FIG. 18 comprises individual prisms 132 fabricated over the laser diodes 126, it is understood that all of prisms may be made from a single piece of glass or molded from a sheet of plastic, for example. The illustration of FIG. 19 exemplifies such an embodiment with the different sized wedge shaped prisms made from a single sheet or layer of material 134 which is disposed over the surface 128 with the prisms aligned over their respective laser diodes 126 of the emitter section. The embodiment illustrated in FIG. 19 will function similar to that described for the embodiment of FIG. 18.

While the present invention has been described herein above in connection with a plurality of embodiments, it is understood that these embodiments were presented solely by way of example. Accordingly, the present invention should not be limited in any way to the presented embodiments, but rather construed in breadth and broad scope in accordance with the recitation of the claims appended hereto.

What is claimed is:

1. An array of light beam emitter sections within an optical communication apparatus, said apparatus comprising:
    said array comprising:
        a substrate having a surface divided into an array of sections;
        a grouping of light emitters disposed at each surface section, each grouping of light emitters comprising multiple light emitters structured such that each individual light emitter in that grouping emits a light beam at a different emission angle with respect to said surface; and
        a controller coupled to said light emitters that is programmed to select at least one light emitter of each grouping based on which light emitter in that grouping emits a light beam at an emission angle that provides a maximum of light energy to a corresponding light detector relative to light beams emitted by other emitters in that grouping, and to then actuate only that at least one selected light emitter to produce a steered light beam that transmits data to that corresponding light detector to establish an optical communication channel.

2. The apparatus of claim 1 wherein the controller is programmed to sequentially and individually operate each light emitter in a grouping to determine which emits a light beam at an emission angle that is best received by the corresponding light detector.

3. The array of claim 1 wherein the light emitters are fabricated on the surface sections of the substrate.

4. The array of claim 1 wherein the light emitters comprise laser diodes.

5. The array of claim 1 wherein each surface section of the substrate is concave shaped; and wherein the light emitters of each grouping are distributed within their corresponding concave shaped section to emit light beams at the different emission angles.

6. The array of claim 1 wherein each surface section of the substrate is convex shaped; and wherein the light emitters of each grouping are distributed within their corresponding convex shaped section to emit light beams at the different emission angles.

7. The array of claim 1 including an optical element disposed over each grouping of light emitters to direct the emitted light beams thereof at the different emission angles.

8. The array of claim 7 wherein the optical element comprises a layer of material configured into differently sized prisms that are aligned with the light emitters of the corresponding grouping.

9. The array of claim 7 wherein the optical element comprises individual and differently sized prisms correspondingly disposed over the light emitters of the corresponding grouping.

10. The array of claim 9 wherein the prisms are wedge shaped.

11. The apparatus of claim 1, wherein said controller is further programmed to compare light energy provided by a particular said light emitter to the corresponding light detector with a minimum threshold.

12. The apparatus of claim 11, wherein said controller is further programmed to pair a particular light emitter and the corresponding light detector if the light energy provided to the light detector by the particular light emitter exceeds said minimum threshold and said light detector has not already been paired with another light emitted.

13. The apparatus of claim 1, wherein the controller is further configured to periodically re-select which light beam emitter in a grouping provides a maximum of light energy to said corresponding light detector relative to other emitters in that grouping.

14. The apparatus of claim 13, wherein the controller is configured to re-select which light beam emitter in a grouping provides a maximum of light energy to said corresponding light detector relative to other emitters in that grouping when an error rate exceeds a threshold.

* * * * *